United States Patent
Rhee et al.

(10) Patent No.: US 7,301,410 B2
(45) Date of Patent: Nov. 27, 2007

(54) HYBRID CURRENT-STARVED PHASE-INTERPOLATION CIRCUIT FOR VOLTAGE-CONTROLLED DEVICES

(75) Inventors: Woogeun Rhee, Norwood, NJ (US); Daniel J. Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/369,475

(22) Filed: Mar. 7, 2006

(65) Prior Publication Data

US 2007/0222530 A1  Sep. 27, 2007

(51) Int. Cl.
*H03B 5/24* (2006.01)
*H03K 5/14* (2006.01)

(52) U.S. Cl. .......................... 331/57; 327/237

(58) Field of Classification Search ............. 331/8, 331/18, 25, 57, 177 R; 327/156–159, 237, 327/246–247, 250–251
See application file for complete search history.

(56) References Cited

U.S. PATENT DOCUMENTS 5,841,325 A * 11/1998 Knotts et al. ............... 331/57
6,377,129 B1    4/2002 Rhee et al.

OTHER PUBLICATIONS

Ian A. Young, et al., "A PLL Clock Generator with 5 to 110 MHz of Lock Range for Microprocessors", IEEE Journal of Solid-State Circuits; vol. 27, No. 11, Nov. 1992; pp. 1599-1607.
Jonghae Kim et al., : A 44GHz Differentially Tuned VCO with 4GHz Tuning Range in 0.2um SOI CMOS, ISSCC 2005, Session 22/ PLL, DLL, and VCOs /22.4; 3 pages.
Jafar Savoj et al, "A 10-Gb/s CMOS Clock and Data Recovery Circuit with a Half-Rate Linear Phase Detector", IEEE Journal of Sold-State Circuits, vol. 36, No. 5, May 2001; pp. 761-767.
Woogeun Rhee, "A Low Power, Wide Linear-Range CMOS Voltage-Controlled Oscillator", IEEE, 1998; pp. 11-85 to 11-88.

* cited by examiner

*Primary Examiner*—David Mis
(74) *Attorney, Agent, or Firm*—Keusey, Tutunjian & Bitetto, P.C.; Anne V. Dougherty, Esq.

(57) ABSTRACT

A hybrid circuit includes a current-starved voltage-controlled circuit configured to adjust a first type of signal difference, and a phase-interpolated voltage controlled circuit configured to adjust a second type of signal difference. The current-starved circuit and the phase-interpolated circuit cooperate to provide improved operational performance of the hybrid circuit.

35 Claims, 5 Drawing Sheets

VCD1: Current-Starved
VCD2: Phase-interpolation

HYBRID CURRENT-STARVED PHASE-INTERPOLATION CIRCUIT FOR VOLTAGE-CONTROLLED DEVICES

BACKGROUND

1. Technical Field

The present invention generally relates to a voltage-controlled oscillator and a voltage-controlled delay line, and more particularly, to a voltage-controlled oscillator or a voltage-controlled delay line using hybrid current-starved phase-interpolation.

2. Description of the Related Art

Voltage-controlled delay (VCD) elements are useful in many applications. VCDs are important blocks in delay-locked loops (DLL) which synchronize an internal clock with an incoming clock.

Referring to FIG. 1, a typical block diagram of a DLL 10 is shown, which has a phase detector (PD) 14, a loop filter (LPF) 16, and a voltage-controlled delay line (VCDL) 12. The phase detector 14 compares the timing difference between a reference clock edge $\phi_{ref}$ and a clock edge from the VCDL 12, which is a delayed version of a clock input, $\phi_{in}$. Phase detector 14 generates an error voltage for the VCDL 12 to adjust the phase shift $\phi_{out}$. The phase detector 14 is usually accompanied by a charge pump (CP) in typical IC designs.

The loop filter 16 between the phase detector 14 and the VCDL 12 rejects high frequency noise. The feedback operation provides a control voltage $V_{ctr}$ by a feedback loop 17, which forces the internal clock edge $\phi_{ref}$ to be aligned to the incoming clock edge $\phi_{in}$.

Also, the VCD has been employed to build a ring-oscillator voltage-controlled oscillator (VCO) which is one important building block in phase-locked loop (PLL) design.

Referring to FIG. 2, a delay line in a phase locked loop 20 includes a ring-oscillator VCO 22 having a plurality of VCDs 12. A phase-and-frequency detector (PFD) 14 and loop filter 16 are employed to provide a control signal to VCO 18.

For digital clock generation, current-starved ring VCOs 22 shown in FIG. 3 have been primarily used in the monolithic PLLs since they provide wide tuning range and high integration. (See e.g., I. Young, et. Al, "A PLL clock generator with 5 to 110 MHz of lock range for microprocessors", IEEE JSSC, November 1992).

Referring to FIG. 3, the oscillation frequency of the current-starved ring VCO 22 is directly related to the delay time of each delay element 12, resulting in high sensitivity to process, voltage, and temperature (PVT) variation. The nonlinear voltage-to-frequency transfer characteristic of the current-starved ring VCO 22 results in a highly variable VCO gain characteristic which is undesirable in PLL implementations.

The VCO 18 includes a $V_{ref}$ input to a replica cell 24. The VCO 18 includes transistors M1, M2, M3 and M4. M3 and M4 are controlled in accordance with the output of the replica cell 24. Vdd is the supply voltage, and $V_{ctl}$ is employed to control a variable current source 26 at the foot of the oscillator. VIN and VINB represent V input and V input bar signals, and VO and VOB represent V output and V output bar signals, respectively. M1 and M2 are controlled in accordance with VIN and VINB, respectively.

Referring to FIG. 4, another way of implementing VCD elements is using a phase-interpolation method. An example of a circuit 30 implementation for phase-interpolation is shown in FIG. 4 and described in J. Savoj and B. Razavi, "A 10-Gb/s CMOS clock and data recovery circuit with a half-rate linear phase detector", IEEE, JSSC, May 2001.

Compared to a VCD using a current-starved approach, a VCD 32 using a phase-interpolation method offers reduced phase noise and more linear voltage-to-frequency characteristics. However, VCD 32 has less tuning range than the current-starved ring oscillator. For this reason, the current-starved method is still widely used in digital clock generation applications.

SUMMARY

A hybrid current-starved phase interpolation method for a voltage-controlled delay line and voltage-controlled oscillator provides a wide linear tuning range as well as good noise performance. Coarse tuning control is provided by the current-starved method to provide the wide tuning range over process and temperature variations, while the phase interpolation method is used to offer a linear tuning curve as well as low jitter performance. Additional control can be achieved with a programmable reference voltage which will set the output swing. The differential fine tuning control path of the VCD topology based on the phase interpolation method also provides better noise immunity against supply and substrate noise.

An adjusting circuit includes a current-starved voltage-controlled circuit configured to adjust a first type of signal difference. A phase-interpolated voltage controlled circuit is configured to adjust a second type of signal difference. The current-starved circuit and the phase-interpolated circuit cooperate to provide improved operational performance of the adjusting circuit.

A hybrid circuit includes a current-starved voltage-controlled circuit configured to adjust a first type of signal difference, and a phase-interpolated voltage controlled circuit configured to adjust a second type of signal difference. The current-starved circuit and the phase-interpolated circuit cooperate to provide improved operational performance of the hybrid circuit.

A hybrid circuit includes a swing fixing circuit responsive to an input reference voltage for adjusting loads coupled to a supply voltage, and a switching block responsive to an input voltage and the adjusted supply voltage to compare the reference voltage to the input voltage using a phase-interpolated method and adjust a difference between the reference voltage and the input voltage. An adjustment circuit is included for coarse and fine adjustment of the difference using tail current sources in accordance with a current-starved method.

A hybrid adjusting circuit includes a current-starved phase interpolation voltage-controlled circuit for adjusting input signals. The voltage-controlled circuit includes a coarse tuning control circuit configured to employ the current-starved method to provide the wide tuning range over process and temperature variations and a fine tuning control circuit configured to employ the phase interpolation method to offer a linear tuning curve and low jitter performance. A swing fixing circuit is responsive to a programmable reference voltage and configured to set an output swing for adjusting loads coupled to a supply voltage.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
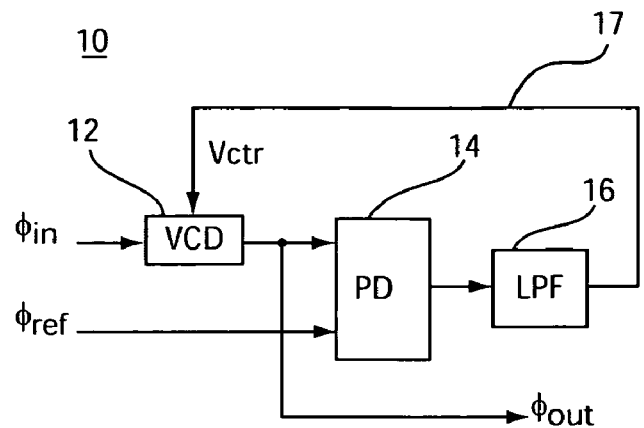
FIG. 1 is a block diagram showing a known voltage-controlled delay (VCD) for use in a delay-locked loop.
Figure 2:
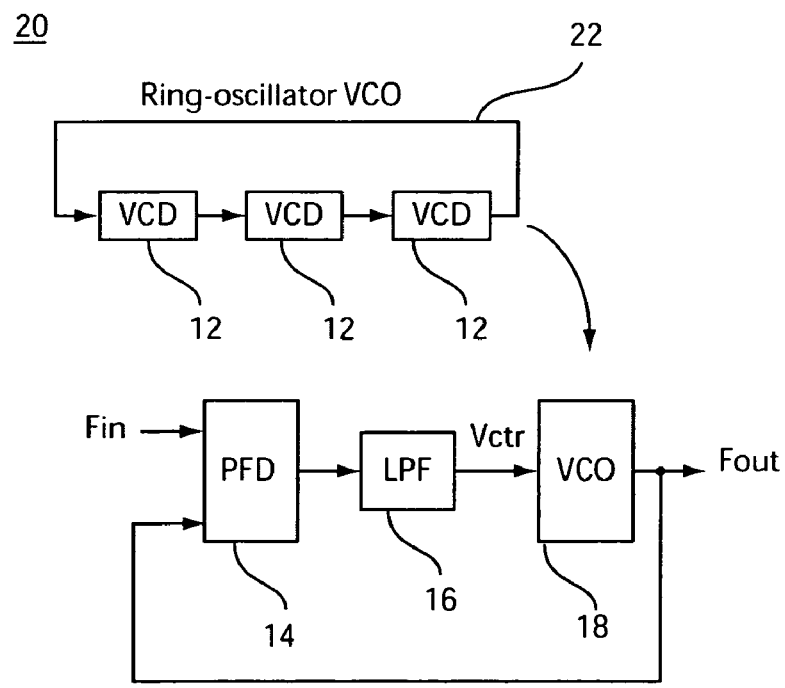
FIG. 2 is a block diagram showing a known voltage-controlled delay (VCD) for use in a phase-locked loop.
Figure 3:
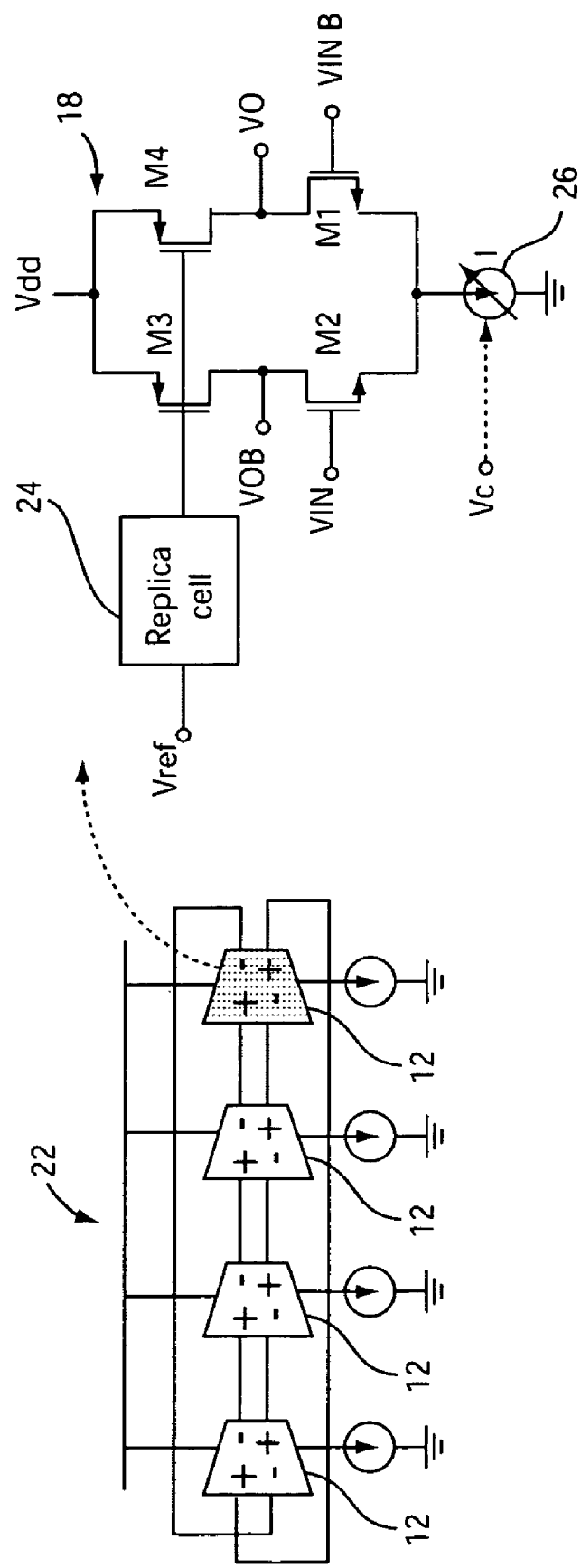
FIG. 3 is a schematic diagram illustrating a conventional current-starved delay cell.

A hybrid voltage controlled delay (VCD) employs both a current-starved method and a phase interpolation method. The VCD or voltage controlled oscillator (VCO) may include two control inputs, one input for coarse tuning control and the other input for fine tuning control. Coarse tuning control may be performed by the current-starved method to provide wide tuning range over process and temperature variations, while the phase interpolation method is used to achieve a linear tuning curve and low jitter performance.

Use of the current-starved method with active field effect transistor (e.g., FET) loads instead of resistor loads enables implementing nested current-starved VCD elements within phase-interpolated delay elements. In this way, the current-starved VCD within the phase-interpolated delay can track phase variations with large tail current variations.

Also, the hybrid VCD topology can be further extended to build composite voltage-controlled delay lines (VCDLs) using both current-starved VCD and hybrid VCD or interpolating VCDs and hybrid VCDs. One example is a ring VCO using both current-starved VCD and hybrid VCD.

Since the VCD has a dual input, the coarse tuning also reduces the control voltage range of the fine-tuning control. The reduced control voltage range for the fine-tuning path provides linear VCD gain as well as minimum VCD gain variation over a wide tuning range. The reduced voltage range in the loop filter enhances static phase offset performance of phase locked loops (PLLs) or delay locked loops (DLL) by easing charge pump design constraints.

In addition to the coarse tuning, another control can be achieved with a programmable reference voltage which will set the VCD output swing. Since the VCO output swing in the PLL design is one important parameter in determining noise performance as well as the tuning range, the controlled output swing can be used to optimize the noise performance over, for example, the process variation.

The coarse tuning path can be controlled digitally by having a current digital-to-analog converter. The fine-tuning path needs to be controlled by an analog voltage. However, depending on PLL topology, both coarse-tuning path and fine-tuning path can be controlled either in digital or in analog. Noise sensitivity should be minimized for the control path.

In integrated circuits, it is advantageous to employ differential signals to provide increased immunity to on-chip noise and signal coupling. The VCD topology of the present embodiments may be based on the phase interpolation method and can accommodate differential control for the fine-tuning path. Therefore, compared to conventional current-starved ring VCDs, the present embodiments for VCD provide better immunity to supply noise, wider linear tuning range, less VCD gain variation, and better noise performance.

Embodiments described herein may be implemented in a circuit. The circuit as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 4:
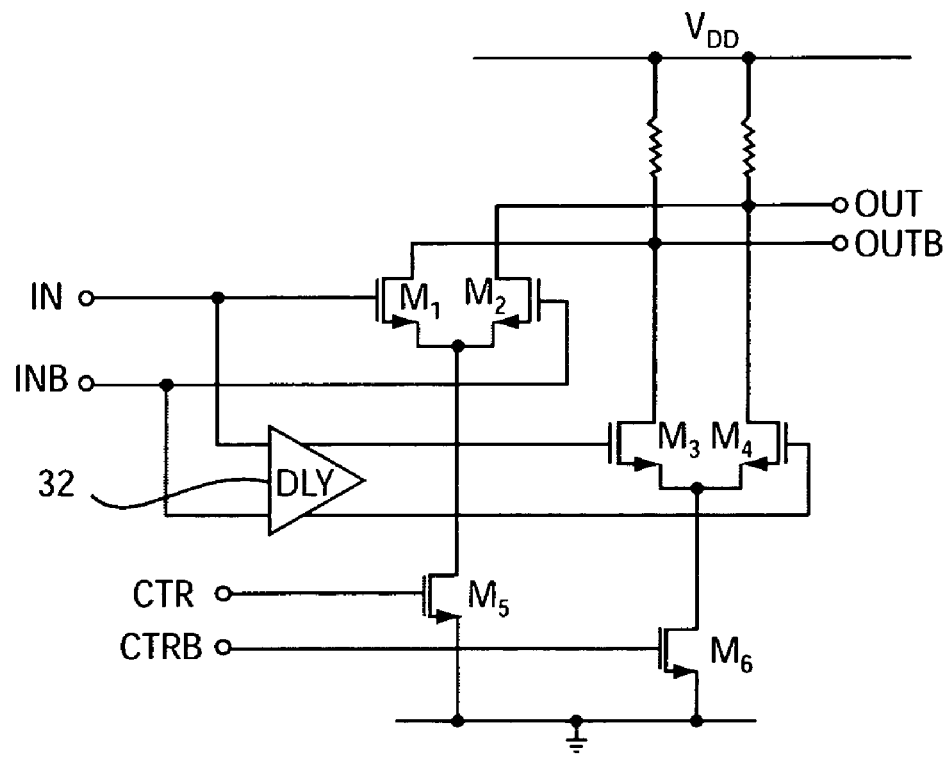
FIG. 4 is a schematic diagram illustrating a conventional phase-interpolated delay cell.
Figure 5:
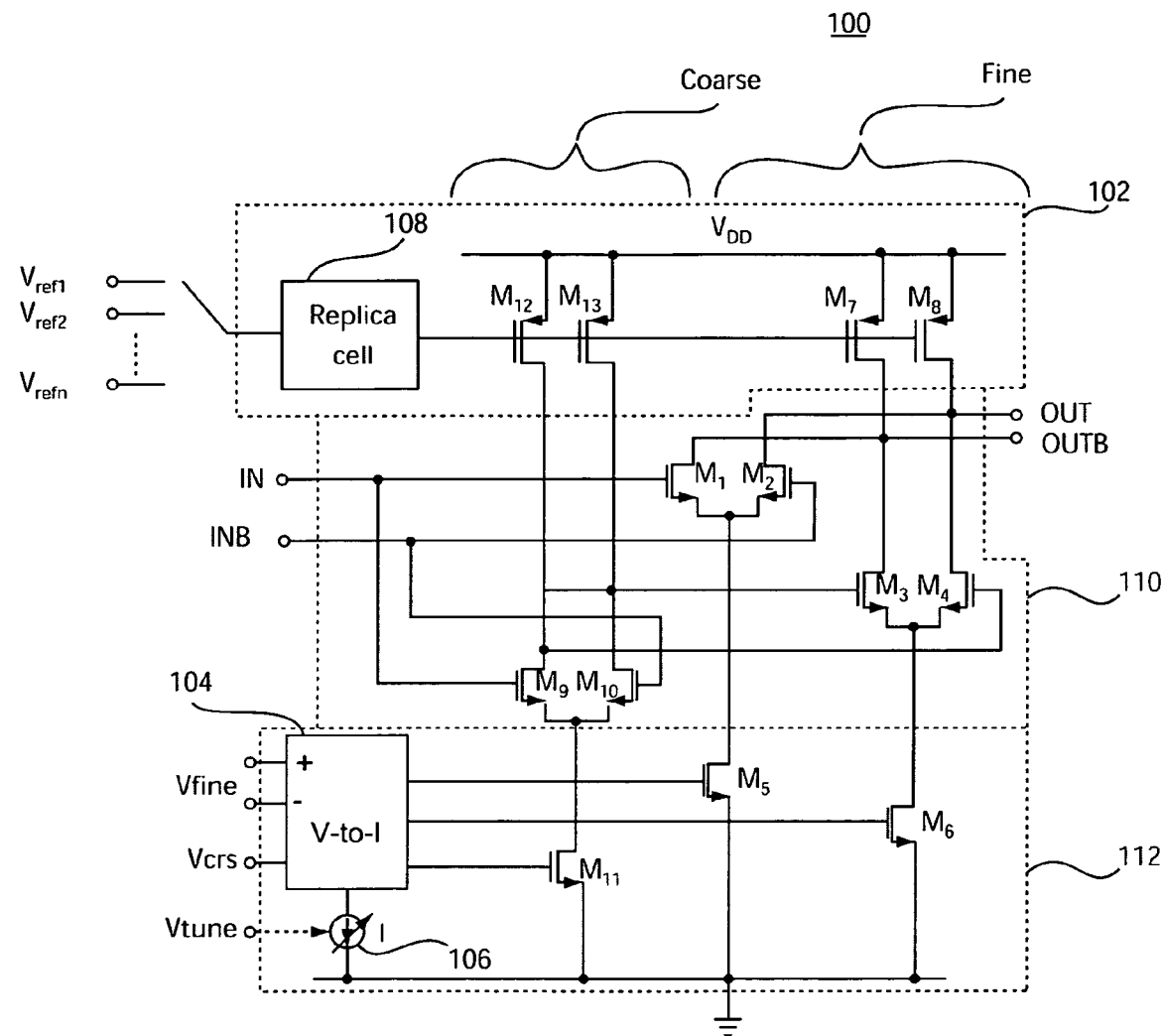
FIG. 5 is an illustrative schematic diagram illustrating a hybrid current-starved phase-interpolation delay cell in accordance with one embodiment.

Referring now to the drawings in which like numerals represent the same or similar elements and initially to FIG. 5, an exemplary embodiment of an adjusting circuit 100 illustratively depicted as a hybrid VCD cell or circuit according to aspects of the present invention is shown. Transistors M1-M8 perform phase interpolation with active loads M7 and M8 for fine adjustment. Transistors M9-M13 generate delayed signal paths for phase interpolation, the function of which is similar to that of the VCD 32 shown in FIG. 4.

A swing fixing circuit 102 is implemented by a replica cell 108 and p-channel CMOS load transistors M7, M8, M12 and M13. Sources of transistors M7, M8, M12, and M13 are coupled to supply voltage $V_{DD}$ and the gates of transistors M7, M8, M12 and M13 are coupled to replica cell 108. The reference voltage $V_{ref}$ provided by replica cell 108 is programmable to fix the voltage swing $V_{SW}$ across load transistors M7, M8, M12, and M13, wherein $V_{ref}=V_{DD}-V_{SW}$. The replica cell 108 senses the voltage swing and adjusts the effective load resistances of M12, M13, M7 and M8 (e.g., the resistances of the transistors: RM12, RM13, RM7, RM8) to set the voltage swing $V_{SW}$ to Vdd—$V_{ref}$. The effective load resistance for a transistor is defined as: $R_M=1/(\mu_p C_{ox}(V_{GS}-V_T))(W/L)$; wherein $\mu_p$ is hole mobility, $C_{ox}$ is the capacitance of the gate oxide, $V_{GS}$ is the gate source voltage, $V_T$ is the threshold voltage of the transistor, W is the channel width and L is the channel length. The voltage swing limits the swing of the VCD output signal (OUT or OUTB).

Control can be achieved with a programmable reference voltage ($V_{ref1}$ through $V_{refn}$) which will set the VCD output swing ($V_{SW}$). Since the VCD output swing is an important parameter to determine noise performance as well as the tuning range, the controlled output swing can be used to optimize the noise performance over process variation.

The voltage swing $V_{SW}$ limits the swing of the VCD output signal OUT. Hence, control can be achieved with the programmable reference voltage ($V_{ref1}$ through $V_{refn}$) which will set the VCD output swing $V_{SW}$.

A switching block 110 is implemented by n-channel CMOS switching transistors M1-M4 and M9-M10. Switching block 110 compares and adjusts the input voltages with the reference voltage(s) in accordance with the load adjustments in transistors M12, M13, M7 and M8 and the coarse and fine adjustments input from a bias control circuit 112.

Bias currents of transistors M5 and M6 are controlled by a fine tuning control voltage, Vfine, by way of a voltage-to-current (V-to-I) converter 104. The bias current of M11 is controlled by a coarse tuning control voltage, Vcrs. A reference current, I, the value of which may be established by a current digital-to-analog converter (DAC) (not shown) is generated by a variable current source 106. Current source 106 may be controlled using a control signal (Vtune). Since the voltage swing $V_{SW}$ is determined by the tail current I and the effective load resistance, $R_M$, the current source 106 helps to control the delay between the input signal (IN) and the output signal (OUT). For example, increasing the tail current, I, makes the effective load resistance $R_M$ reduced by the swing fixing circuit 102 to maintain the fixed voltage swing $V_{SW}$, which in turn reduces the delay time. Hence, transistors M11, M5 and M6 function as tail current sources and provide the ability to coarsely and/or finely adjust the differences between signals.

The hybrid VCD 100 employs the advantages of both the current-starved method and the phase interpolation method. The VCD or VCO includes two control inputs Vcrs and Vfine, one for coarse tuning control and the other for fine tuning control, respectively. Coarse tuning control is done by the current-starved method to provide a wide tuning range over process and temperature variations, while the phase interpolation method is used to offer a linear tuning curve and low jitter performance.

Use of the current-starved method with active PFET loads (e.g., M7, M8, M12 and M13) instead of resistor loads enables implementing nested current-starved VCD within the phase-interpolated delay element. In this way, the current-starved VCD within phase-interpolated delay can track phase variation with large tail current variation using variable current source 106.

Also, the hybrid VCD topology can be further extended to build composite voltage-controlled delay lines (VCDLs) using both current-starved VCD and hybrid VCD. Having similar kinds of active PFET loads, the hybrid VCD can track the common-mode voltage of the current-starved VCD, which in turn is advantageous to implement the composite VCDL. One example of a ring VCO using both current-starved VCD and hybrid VCD is shown in FIG. 6.

Since the VCD 100 has a dual input, Vcrs and Vfine, the coarse tuning reduces the control voltage range of the fine-tuning control. The reduced control voltage range for the fine-tuning path provides linear VCO gain as well as minimum VCO gain variation over a wide tuning range. Since VCO gain variation mostly determines PLL loop dynamics variation, having linear VCO gain helps to provide uniform PLL bandwidth. Maintaining uniform PLL bandwidth is one important consideration to minimize random jitter (RJ) variation. The reduced voltage range in a loop filter (not shown) also enhances static phase offset performance of phase locked loops (PLLs) or delay locked loops (DLL) by easing charge pump design constraints.

In addition to the coarse tuning, another control can be achieved with a programmable reference voltage ($V_{ref}$) which will set the VCD output swing. The controlled output swing $V_{SW}$ can be used to optimize the noise performance over the process variation. Converter 104 may include a digital to analog converter such that the coarse tuning path can be controlled digitally by having a current digital-to-analog converter. The fine-tuning path should be controlled by an analog voltage. However, depending on PLL topology, both coarse-tuning path and fine-tuning path can be controlled either in digital or in analog.

Figure 6:
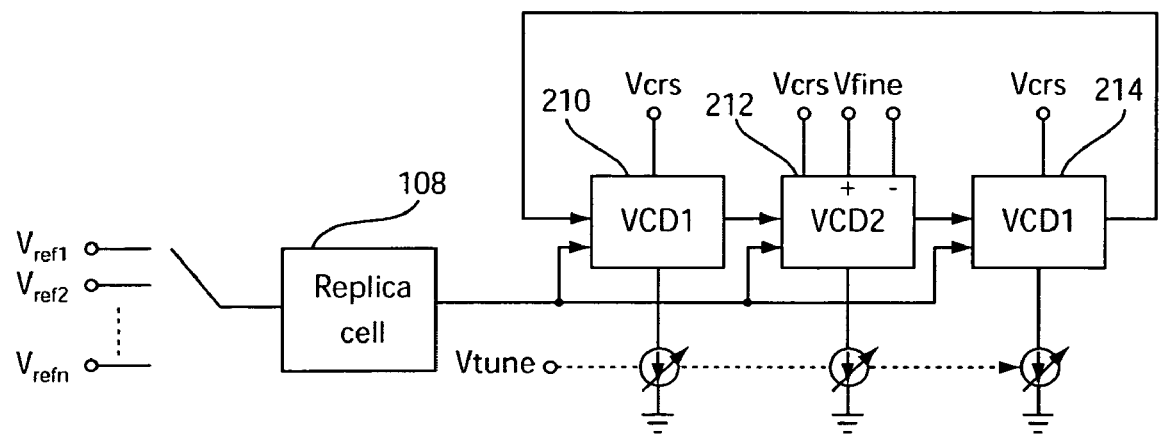
FIG. 6 is an illustrative schematic diagram of an example of a hybrid ring oscillator in accordance with one illustrative embodiment.

Referring to FIG. 6, an example of a hybrid ring-oscillator 200 using current-starved and phase-interpolation methods is illustratively shown; however, it is to be understood that the present invention may be employed in a plurality of other circuits, e.g., in a VCO, DLL, PLL, etc. In this case, the ring VCO 200 includes a three stage VCD. A first VCD 210 and a third VCD 214 are based on current-starved delay cells for coarse tuning, and a second VCD 212 is based on a hybrid phase-interpolated VCD. This topology makes the VCO 200 have up to four independent control inputs, which could provide flexible VCO input control in a PLL design.

The four independent inputs include a Vcrs for coarse adjustment to VCDs 210 and 214, a Vcrs for coarse adjustment of VCD 212 and two Vfine inputs for VCD 212 for fine adjustment.

Having described preferred embodiments of hybrid current-starved phase-interpolation circuit for voltage-controlled devices (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A hybrid circuit, comprising:
a current-starved voltage-controlled circuit configured to adjust a first type of signal difference; and
a phase-interpolated voltage controlled circuit configured to adjust a second type of signal difference, wherein the current-starved circuit and the phase-interpolated circuit cooperate to provide improved operational performance of the hybrid circuit.

2. The circuit as recited in claim 1, further comprising a swing fixing circuit configured to adjust loads to provide adjustment for the current-starved and phase-interpolated circuits.

3. The circuit as recited in claim 2, wherein the swing fixing circuit includes a replica cell and the loads include load transistors adjusted in accordance with a replica cell output such that voltage swings relative to a reference voltage are accounted for by the adjustment of the loads.

4. The circuit as recited in claim 3, wherein the reference voltage includes a programmable reference voltage.

5. The circuit as recited in claim 1, further comprising a switching block implemented by linear-mode transistors to provide variable load resistance for having fixed output swing.

6. The circuit as recited in claim 1, wherein the first type of signal difference includes a coarse difference between signals and the second type of signal difference includes a fine difference.

7. The circuit as recited in claim 6, wherein coarse tuning control provides a tuning range over process and temperature variations by adjusting for coarse signal differences.

8. The circuit as recited in claim 6, wherein fine tuning control provides a linear tuning curve and reduced jitter by adjusting for fine signal differences.

9. The circuit as recited in claim 1, further comprising tail current sources coupled to ground, the current sources being responsive to control signals to adjust for the first and second types of signal differences.

10. The circuit as recited in claim 9, wherein the current sources include transistors.

11. The circuit as recited in claim 9, wherein the control signals are voltages, and further comprising a voltage to current converter coupled in series with a variable current source connected to ground to adjust current to the tail current sources.

12. The circuit as recited in claim 1, wherein the hybrid circuit is included in a delay locked loop.

13. The circuit as recited in claim 1, wherein the hybrid circuit is included in a phase locked loop.

14. The circuit as recited in claim 1, wherein the hybrid circuit is included in a voltage controlled oscillator.

15. A hybrid circuit, comprising:
a swing fixing circuit responsive to an input reference voltage for adjusting loads coupled to a supply voltage;
a switching block responsive to an input voltage and the adjusted supply voltage to compare the reference voltage to the input voltage using a phase-interpolated method and adjust a difference between the reference voltage and the input voltage; and
an adjustment circuit for coarse and fine adjustment of the difference using tail current sources in accordance with a current-starved method.

16. The circuit as recited in claim 15, wherein the swing fixing circuit includes a replica cell and the loads include load transistors adjusted in accordance with a replica cell output such that voltage swings relative to a reference voltage are accounted for by the adjustment of the loads.

17. The circuit as recited in claim 16, wherein the reference voltage includes a programmable reference voltage.

18. The circuit as recited in claim 15, wherein the switching block is implemented by switching transistors to provide comparison of the reference voltage with the input voltage.

19. The circuit as recited in claim 15, further comprising circuitry dedicated for coarse adjustment and circuitry dedicated to fine adjustment between the reference voltage and the input voltage.

20. The circuit as recited in claim 19, wherein coarse adjustment circuitry provides a wide tuning range over process and temperature variations.

21. The circuit as recited in claim 19, wherein the fine adjustment circuitry provides a linear tuning curve and reduced jitter.

22. The circuit as recited in claim 15, wherein the tail current sources are coupled to ground, the tail current sources being responsive to control signals to adjust for coarse and fine signal differences.

23. The circuit as recited in claim 22, wherein the current sources include transistors.

24. The circuit as recited in claim 22, wherein the control signals are voltages, and further comprising a voltage to current converter coupled in series with a variable current source connected to ground to adjust current to the tail current sources.

25. The circuit as recited in claim 15, wherein the hybrid circuit is included in a delay locked loop.

26. The circuit as recited in claim 15, wherein the hybrid circuit is included in a phase locked loop.

27. The circuit as recited in claim 15, wherein the hybrid circuit is included in a voltage controlled oscillator.

28. A hybrid adjusting circuit, comprising:
a current-starved phase interpolation voltage-controlled circuit for adjusting input signals, the voltage-controlled circuit including:
a coarse tuning control circuit configured to employ the current-starved method to provide the wide tuning range over process and temperature variations;
a fine tuning control circuit configured to employ the phase interpolation method to offer a linear tuning curve and low jitter performance; and
a swing fixing circuit responsive to a programmable reference voltage and configured to set an output swing for adjusting loads coupled to a supply voltage.

29. The adjusting circuit as recited in claim 28, wherein the swing fixing circuit includes a replica cell and the loads include load transistors adjusted in accordance with a replica cell output such that voltage swings relative to a reference voltage are accounted for by the adjustment of the loads.

30. The adjusting circuit as recited in claim 28, wherein the coarse and fine tuning control circuits include tail current sources coupled to ground, the tail current sources being responsive to control signals to adjust for coarse and fine signal differences.

31. The adjusting circuit as recited in claim 30, wherein the current sources include transistors.

32. The adjusting circuit as recited in claim 30, wherein the control signals are voltages, and further comprising a voltage to current converter coupled in series with a variable current source connected to ground to adjust current to the tail current sources.

33. The adjusting circuit as recited in claim 28, wherein the adjusting circuit is included in a delay locked loop.

34. The adjusting circuit as recited in claim 28, wherein the adjusting circuit is included in a phase locked loop.

35. The adjusting circuit as recited in claim 28, wherein the adjusting circuit is included in a voltage controlled oscillator.

* * * * *